United States Patent
Ju (10) Patent No.: US 7,075,818 B2
(45) Date of Patent: Jul. 11, 2006

(54) MAGNETIC RANDOM ACCESS MEMORY WITH STACKED MEMORY LAYERS HAVING ACCESS LINES FOR WRITING AND READING

(75) Inventor: Kochan Ju, Monte Sereno, CA (US)

(73) Assignee: Maglabs, Inc., San Jose, CA (US)

( * ) Notice: Subject to any disclaimer, the term of this patent is extended or adjusted under 35 U.S.C. 154(b) by 206 days.

(21) Appl. No.: 10/924,360

(22) Filed: Aug. 23, 2004

(65) Prior Publication Data

US 2006/0039188 A1    Feb. 23, 2006

(51) Int. Cl.
*G11C 11/00* (2006.01)

(52) U.S. Cl. .................... 365/158; 365/55; 365/66; 365/171

(58) Field of Classification Search .............. None
See application file for complete search history.

(56) References Cited

U.S. PATENT DOCUMENTS

| | | | |
|---|---|---|---|
| 5,640,343 A | 6/1997 | Gallagher et al. | |
| 5,703,805 A | 12/1997 | Tehrani et al. | |
| 5,838,608 A | 11/1998 | Zhu et al. | |
| 5,920,500 A * | 7/1999 | Tehrani et al. | 365/173 |
| 5,930,164 A | 7/1999 | Zhu | |
| 6,072,718 A | 6/2000 | Abraham et al. | |
| 6,169,689 B1 | 1/2001 | Naji | |
| 6,269,018 B1 | 7/2001 | Monsma et al. | |
| 6,272,041 B1 | 8/2001 | Naji | |
| 6,331,943 B1 | 12/2001 | Naji et al. | |
| 6,385,082 B1 | 5/2002 | Abraham et al. | |
| 6,515,888 B1 | 2/2003 | Johnson et al. | |

(Continued)

FOREIGN PATENT DOCUMENTS

JP    2003-133528 A2    5/2003

OTHER PUBLICATIONS

Reohr et al., "Memories of Tomorrow", IEEE Circuits & Devices Magazine, Sep. 2002, pp. 17-27.

(Continued)

*Primary Examiner*—Tan T. Nguyen (57) ABSTRACT

A multiple-memory-layer magnetic random access memory (MRAM) has multiple memory layers arranged as pairs and stacked on a substrate. The first memory layer in the pair comprises a plurality of rows of memory cells located between electrically conductive access lines, and the second memory layer in the pair is substantially identical to the first memory layer, but is rotated about an axis perpendicular to the substrate so that the access lines and memory cell rows in one memory layer of the pair are orthogonal to their counterpart lines and rows in the other memory layer. The memory cells in each layer are aligned vertically (perpendicular to the substrate) with the memory cells in the other layer, with the vertically aligned memory cells forming memory cell columns that extend perpendicularly from the substrate. Each memory cell column has an electrical switch between the lowermost memory cell and the substrate.

39 Claims, 9 Drawing Sheets

U.S. PATENT DOCUMENTS

| | | |
|---|---|---|
| 6,535,416 B1 | 3/2003 | Daughton et al. |
| 6,559,511 B1 | 5/2003 | Rizzo |
| 6,590,806 B1 | 7/2003 | Bhattacharyya |
| 6,594,175 B1 | 7/2003 | Torok et al. |
| 6,603,678 B1 | 8/2003 | Nickel et al. |
| 6,621,730 B1 | 9/2003 | Lage |
| 6,631,085 B1 | 10/2003 | Kleveland et al. |
| 6,704,220 B1 | 3/2004 | Lauschner |
| 6,958,502 B1 * | 10/2005 | Lu .............................. 257/295 |
| 2002/0009840 A1 | 1/2002 | Torok et al. |
| 2002/0036331 A1 | 3/2002 | Nickel et al. |
| 2002/0163834 A1 | 11/2002 | Scheuerlein et al. |
| 2003/0090930 A1 | 5/2003 | Rizzo |
| 2003/0156444 A1 | 8/2003 | Lee |
| 2003/0161180 A1 | 8/2003 | Bloomquist et al. |
| 2003/0170976 A1 | 9/2003 | Molla et al. |
| 2003/0198080 A1 | 10/2003 | Iwata |
| 2003/0214835 A1 | 11/2003 | Nejad et al. |

OTHER PUBLICATIONS

Desikan et al.., "On-chip MRAM as a High-Bandwidth, Low-Latency Replacement for DRAM Physical Memories", Department of Computer Sciences Tech Report TR-02-47, The University of Texas at Austin, Sep. 27, 2002.

Katti, "Current-in-plane pseudo-spin-valve device performance for giant magnetoresistive random access memory applications (invited)", Journal of Applied Physics, vol. 91, No. 10, May 15, 2002, pp. 7245-7250.

Katine et al., "Current-induced realignment of magnetic domains in nanostructured Cu/Co multilayer pillars", Appl. Phys. Lett., vol. 76, No. 3, Jan. 17, 2000, pp. 354-356.

* cited by examiner

MAGNETIC RANDOM ACCESS MEMORY WITH STACKED MEMORY LAYERS HAVING ACCESS LINES FOR WRITING AND READING

BACKGROUND OF THE INVENTION

1. Field of the Invention

This invention relates generally to magnetic random access memory (MRAM) and more particularly to MRAM with multiple layers of magnetic memory cells.

2. Description of the Related Art

MRAM with magnetic tunnel junction (MTJ) memory cells has been proposed for nonvolatile memory, as described in U.S. Pat. No. 5,640,343 and by Reohr et al., "Memories of Tomorrow", *IEEE CIRCUITS & DEVICES MAGAZINE*, September 2002, pp. 17–27. In these devices the MTJs are arranged as an array in a single layer (the XY plane) on a semiconductor substrate. In one type of architecture, called a 1T1MTJ MRAM (one transistor and one MTJ), each MTJ is located between a bit line and a transistor, with the word lines located beneath the MTJs. In another type of architecture, called a cross-point (XPC) MRAM, the MTJs are located directly between the bit and word lines. In both MRAM architectures, a selected MTJ cell is "written", i.e. its magnetic state or +/−X magnetization direction is switched, by write currents passing in X and Y directions through the bit and word lines located above and below the selected MTJ. The write currents generate orthogonal magnetic fields in the X and Y directions that switch the magnetization direction of the selected MTJ.

Stacked or multiple-memory-layer MRAM has also been proposed, but is based on either the 1T1MTJ or XPC architecture for single-layer MRAM. These proposed structures require bit and word lines to be formed above and below each memory layer and may require transistors to be formed in each memory layer. This makes fabrication difficult. In addition, no solutions are known to have been proposed for the problem of cell selectivity in multiple-memory-layer MRAM, i.e., the problem of writing to a selected cell in one memory layer without also writing to non-selected cells in other memory layers in the stack.

Co-pending application Ser. No. 10/735,436, filed Dec. 12, 2003, titled "METHOD AND APPARATUS FOR HIGH DENSITY MAGNETIC RANDOM ACCESS MEMORY (MRAM) WITH STACKABLE ARCHITECURE" and assigned to the same assignee as this application describes a multiple-memory-layer MRAM with electrically conductive access lines located in the same layer as rows of memory cells and on the sides of the memory cell rows. In this structure a single layer of bit lines is located above the stack and a single layer of word lines is located below the stack, with the bit and word lines being connected by columns of memory cells formed by the multiple memory layers in the stack. Writing to a selected memory cell is accomplished by current through the access lines adjacent the selected cell simultaneous with current through the selected cell and thus through the other cells in the column containing the selected cell.

Co-pending application Ser. No. 10/884,914, filed Jul. 6, 2004, titled "MAGNETIC RANDOM ACCESS MEMORY WITH MULTIPLE MEMORY LAYERS AND IMPROVED MEMORY CELL SELECTIVTY" and assigned to the same assignee as this application also describes a multiple-memory-layer MRAM with electrically conductive access lines located in the same layer as rows of memory cells and on the sides of the memory cell rows. In this structure writing to a selected memory cell is accomplished by current through the access lines adjacent the selected cell simultaneous with current through the selected cell, but non-selected cells are prevented from being written by the use of oppositely directed current through the access lines in the memory layer directly above or below the memory layer containing the selected cell.

What is needed is an easily-fabricated, multiple-memory-layer MRAM in which a selected cell can be written without the use of current through the cell and without writing to non-selected cells in the other memory layers.

SUMMARY OF THE INVENTION

The invention is a multiple-memory-layer MRAM with the multiple memory layers arranged as pairs and stacked on a substrate. The first or "odd-numbered" memory layer in a pair comprises a plurality of rows of memory cells located between electrically conductive access lines, and the second or "even-numbered" memory layer in a pair is substantially identical to the first memory layer, but is rotated 90 degrees about an axis perpendicular to the substrate. Thus the access lines and memory cell rows in one memory layer of the pair are orthogonal to their counterpart lines and rows in the other memory layer. However, the memory cells in each layer are aligned vertically (perpendicular to the substrate) with the memory cells in the other layers, with the vertically aligned memory cells forming memory cell columns that extend perpendicularly from the substrate. Each memory cell column has an electrical switch between the lowermost memory cell and the substrate.

Each memory cell in the MRAM has a ferromagnetic storage layer with in-plane uniaxial magnetic anisotropy along its easy axis. In each memory layer the memory cells are aligned with their easy axes generally orthogonal to the access lines on either side of the memory cell row. Thus the two memory cells making up each memory cell pair have their easy axes oriented orthogonal to one another.

The electrically conductive access lines are used to generate magnetic fields for writing and reading the memory cells. A selected memory cell is written by applying magnetic fields along both the easy axis and hard axis (the cell's in-plane axis orthogonal to the easy axis) of the ferromagnetic storage film of the selected cell, with each field being less than the field required to switch the magnetization direction of the storage film. However, the composite field from a combination of fields along the two orthogonal in-plane directions will switch the magnetization direction of the storage film of the selected cell. A pair of memory cells, one each from an odd and even memory layer, is "written" at the same time.

A selected cell is read by applying a first current pulse to appropriate access lines to generate a field sufficient to switch the ferromagnetic sensing films, but not the ferromagnetic storage films, in both memory cells of the pair. The electrical switch in the column of the selected cell is turned on and current flows in the column, allowing the electrical resistance of the column to be sensed. A second current pulse of the same amplitude as that of the first pulse is then applied to the access lines to generate a field in a different direction from the field generated by the first current pulse. The electrical resistance the column is sensed after the second pulse is applied, and the difference in the two resistance measurements is used to determine the magnetic state of the selected cell.

The MRAM has cell selectivity, meaning that cells in other memory layers in the stack are not written when the selected cell is being written or read. This is accomplished the use of oppositely directed current through access lines in the odd or even memory layer nearest the odd or even memory layer, respectively, containing the selected cell. The oppositely directed current generates a superposing field near the selected cell to assist in writing or reading the selected cell, and a compensating magnetic field near the non-selected cells that counteracts the field from the access lines laterally adjacent the selected cell.

The MRAM may use flux guides to concentrate the magnetic flux from the access lines and direct it to the memory cells. In one embodiment flux guide elements are associated with the access lines in two adjacent memory layers and are located in regions between the two memory layers.

For a fuller understanding of the nature and advantages of the present invention, reference should be made to the following detailed description taken together with the accompanying figures.

DETAILED DESCRIPTION OF THE INVENTION

Figure 1A:
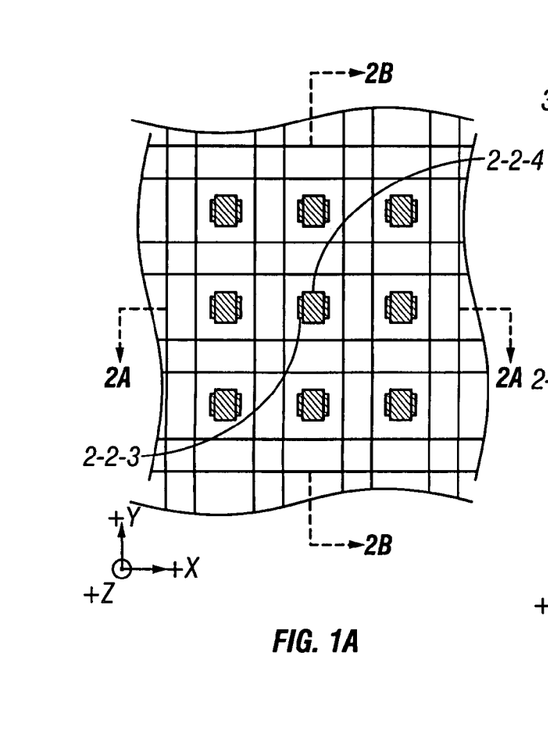
FIG. 1A is a top view of a portion of the MRAM of this invention showing a pair of memory layers, with a second memory layer on top of a first memory layer.
Figure 1B:
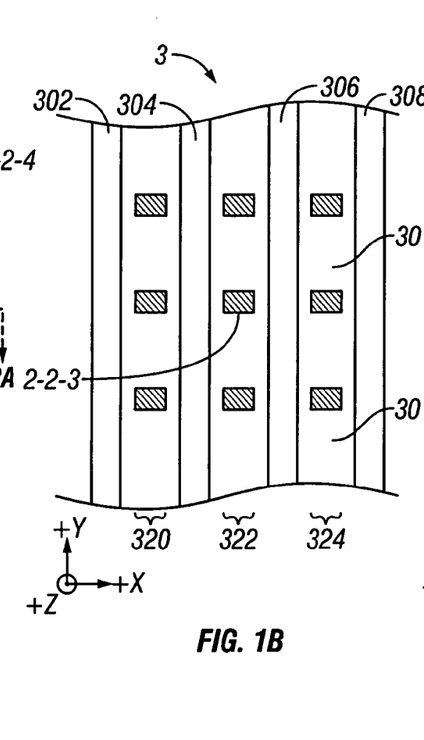
FIG. 1B is a top view of the first memory layer of the pair of memory layers shown in FIG. 1A.
Figure 1C:
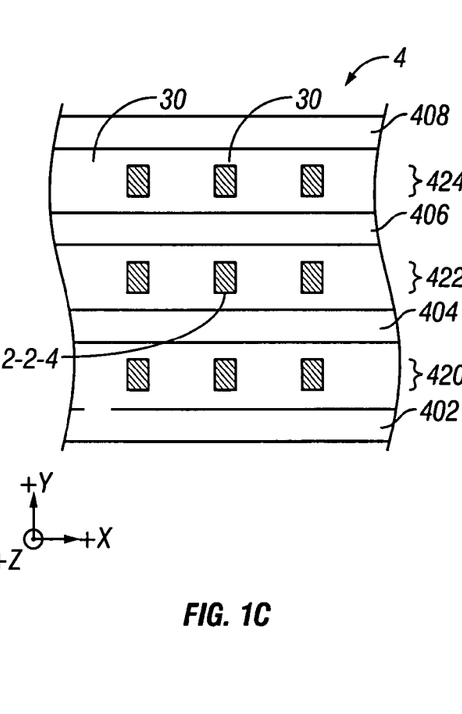
FIG. 1C is a top view of the second memory layer of the pair of memory layers shown in FIG. 1A.

The MRAM of this invention has multiple memory layers arranged as pairs and stacked on a substrate. For ease of description of the figures, the substrate is parallel to the X-Y plane of an X-Y-Z coordinate system with the Z axis being perpendicular to the substrate. FIG. 1A is a top view showing a pair of memory layers, with a second memory layer 4 on top of a first memory layer 3. FIG. 1B is a top view of first memory layer 3 and comprises a plurality of rows of memory cells, such as typical rows 320, 322, 324, located between electrically conductive access lines, such as typical access lines 302, 304, 306, 308. FIG. 1C is a top view of second memory layer 4 and comprises a plurality of rows of memory cells, such as typical rows 420, 422, 424, located between electrically conductive access lines, such as typical access lines 402, 404, 406, 408. Each row of memory cells has access lines on either side but separated from it by electrically insulating material 30. The electrically insulating material 30 also separates the memory cells in each row from each other. The material 30 can be any suitable insulating material used in semiconductors, such as alumina ($Al_2O_3$) or $SiO_2$.

As depicted by FIGS. 1B and 1C, the second memory layer 4 is substantially identical to the first memory layer 3, but is rotated 90 degrees about the Z axis. Thus the access lines and memory cell rows in one memory layer of the pair are orthogonal to their counterpart lines and rows in the other memory layer. However, the memory cells in each layer are aligned vertically (along the Z direction) with the memory cells in the other layer. The vertically aligned memory cells form memory cell columns that extend perpendicularly from the MRAM substrate.

Each memory cell in the multiple-memory-layer MRAM has a unique address, which is required to record a data bit, i.e., "write" to the cell, and to retrieve a recorded data bit, i.e., "read" the cell. In this description a memory cell address can be represented by its X-Y-Z location, where X is the row number in the X direction, Y is the row number in the Y direction, and Z is the number of the memory layer. Thus, for example, the middle memory cell in FIG. 1B has an address 2-2-3 and the middle memory cell in FIG. 1C has an address 2-2-4.

Each memory cell in the multiple-memory-layer MRAM has a ferromagnetic storage layer with in-plane uniaxial magnetic anisotropy, either crystalline anisotropy or shape anisotropy. Uniaxial magnetic anisotropy of a ferromagnetic layer means essentially that all of the magnetic domains tend to align along the same axis, referred to as the easy axis, which is the lowest energy state. The anisotropy field $H_k$ of a ferromagnetic layer with uniaxial magnetic anisotropy is the magnetic field that would need to be applied along the easy axis to switch the magnetization direction. As shown in FIGS. 1A–1C, each memory cell is depicted as having a generally rectangular shape, which is meant to represent that the cell's storage layer has shape anisotropy with the rectangle's long axis being the easy axis and the rectangle's short axis (the axis perpendicular to the long axis) being the hard axis. In each memory layer, the memory cells are aligned with their easy axes generally orthogonal to the access lines on either side of the memory cell row. As shown in FIG. 1A, the result is that the two memory cells making up each memory cell pair have their easy axes oriented orthogonal to one another, as shown by memory cell 2-2-3 located below memory cell 2-2-4. The memory cells have been depicted as rectangles, but any geometric shape that has a long axis, such as an ellipsoid, is possible for the memory cells to have shape anisotropy. Other non-rectangular shapes may be selected to assure a single magnetic domain state in the ferromagnetic storage layer.

Figure 2A:
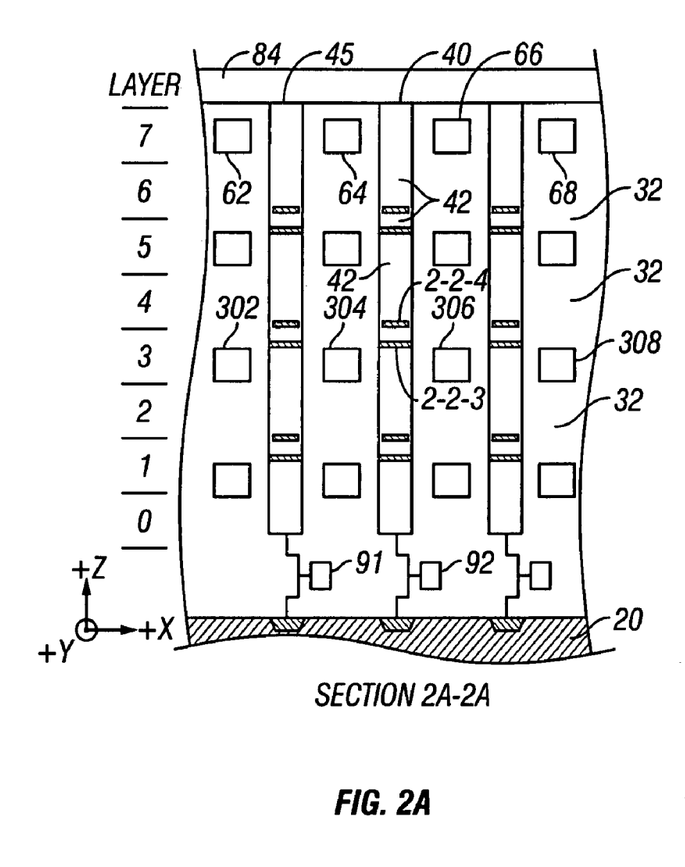
FIGS. 2A and 2B are sectional views through the X-Z and Y-Z planes, respectively, at the section lines 2A—2A and 2B—2B, respectively, of FIG. 1A and show an MRAM with three pairs of memory layers.
Figure 2B:
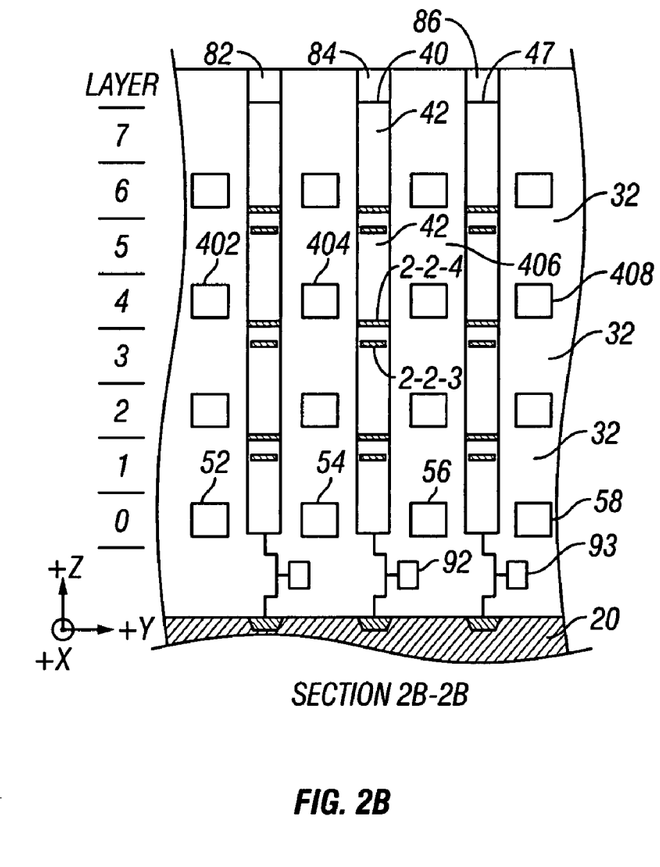

While only a single pair of memory layers (layers 3 and 4) is depicted in FIGS. 1A–1C, the MRAM can have a plurality of pairs of memory layers. FIGS. 2A–2B show a plurality of memory layer pairs stacked on the MRAM substrate 20, which may be silicon, silicon-on-insulator (SOI), or other known semiconductor-based structure. FIGS. 2A–2B are sectional views through the X-Z and Y-Z planes, respectively, at the section lines 2A—2A and 2B—2B, respectively, of FIG. 1A and show an MRAM with three pairs of memory layers (6 memory layers). Thus the sectional views of FIG. 2A and 2B also show layer 3 and layer 4 and their respective memory cells 2-2-3 and 2-2-4. When the MRAM contains a plurality of memory layer pairs, the memory layers in the stack can be categorized as alternating odd-numbered and even numbered memory layers. Thus FIG. 2A depicts the access lines and their associated memory cells for the odd memory layers (layers 1, 3 and 5) and FIG. 2B depicts the access lines and their associated memory cells for the even memory layers (layers 2, 4 and 6). Electrically insulating material 32, such as alumina or $SiO_2$, is located between the access lines of adjacent memory layers to electrically isolate the access lines.

FIGS. 2A–2B illustrate another aspect of the invention. In the odd memory layers the memory cells are located above the midplane of their memory layers, and in the even memory layers the memory cells are located below the midplane of their memory layers. Thus the memory cells in each odd-even pair of memory layers are located relatively close to each other in the Z direction and form pairs of memory cells, such as the pair of memory cells 2-2-3 and 2-2-4. The pairs of memory cells form memory cell columns parallel to the Z axis, such as typical columns 40, 45, 47. The memory cell columns, such as typical column 40 that includes the pair of memory cells 2-2-3 and 2-2-4, also have electrically conductive material 42 between the memory cells.

The MRAM also includes a lower layer and an upper layer that contain no memory cells but only access lines. In the manner to be described later, the access lines in these layers are used to provide compensating magnetic fields near non-selected cells when cells in the adjacent memory layers are selected to be written or read. The lower layer of only access lines is located between memory layer 1 and the substrate 20, as shown by access lines 52, 54, 56, 58 in FIG. 2B. The access lines 52, 54, 56, 58 are aligned parallel to the access lines in the even memory layers (parallel to the X axis). The upper layer of only access lines is located above the uppermost memory layer, as shown by access lines 62, 64, 66, 68 in FIG. 2A. The access lines 62, 64, 66, 68 are aligned parallel to the access lines in the odd memory layers (parallel to the Y axis).

Figure 3:
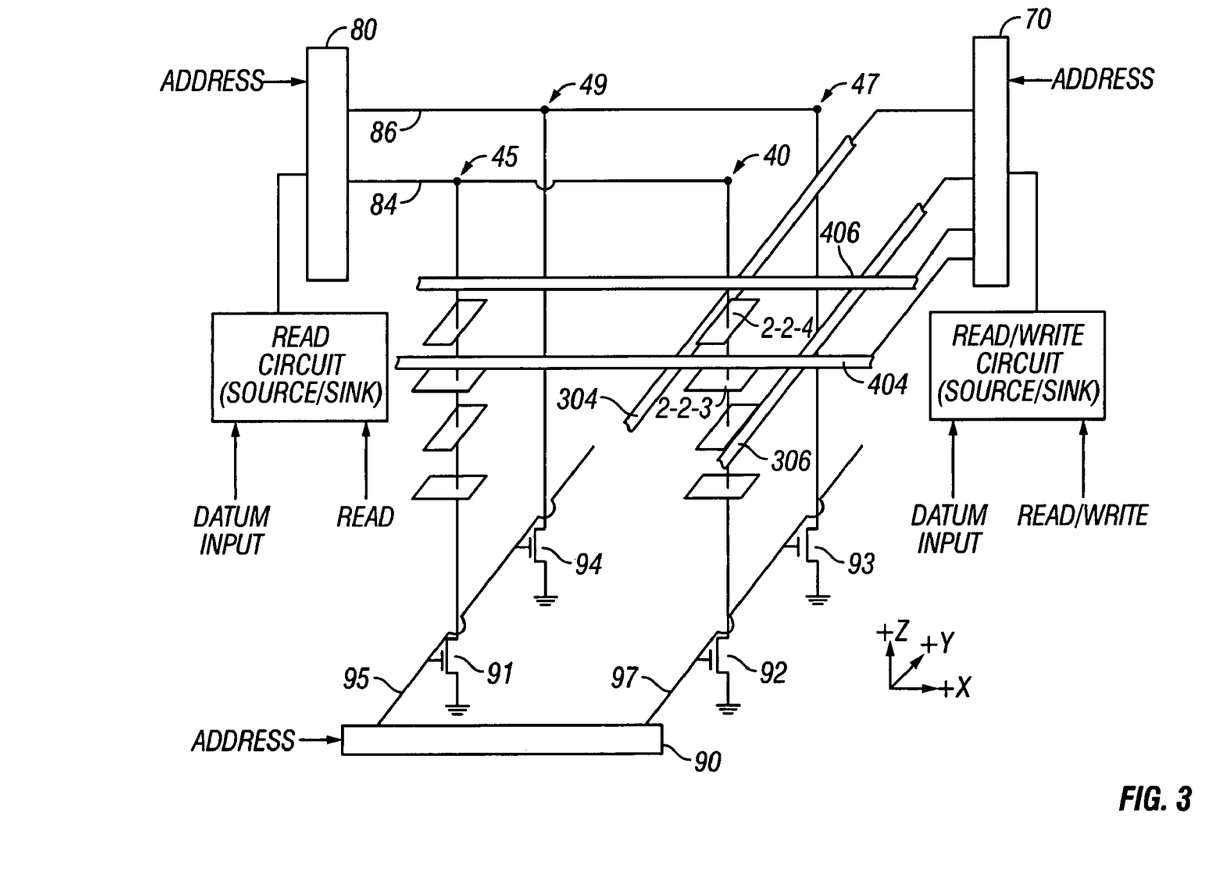
FIG. 3 is a perspective view of a schematic of associated circuitry and bit lines, word lines and access lines for a portion of the MRAM depicted in FIGS. 1A–1C and FIGS. 2A–2B.

FIG. 3 is a perspective view showing the associated read/write circuitry and the bit lines, word lines and access lines for a portion of the MRAM depicted in FIGS. 2A–2B. Only the two typical X-row access lines 304, 306 associated with memory cell 2-2-3 and the two typical Y-row access lines 404, 406 associated with memory cell 22-4 are shown in FIG. 3. The access lines are connected to an access line connect circuit 70.

The side sectional views in FIGS. 2A–2B show three bit lines 82, 84, 86 extending parallel to the X axis across the top of the MRAM structure, with bit line 84 being connected to the memory cell columns that include column 40. The two bit lines 84, 86 are depicted in FIG. 3. Each bit line is connected to the uppermost memory cell in each Y-row of memory cells, with the number of bit lines equaling the number of memory cell Y-rows. As shown in the side sectional views of FIGS. 2A–2B, the vertically aligned memory cells form columns of memory cells, such as columns 45 and 47 in addition to column 40, which extend perpendicularly from substrate 20. FIG. 3 also depicts the memory cell columns near column 40, such as columns 49, 47 connected to bit line 86, but these columns are shown without memory cells for ease of illustration. All memory cell columns that are aligned parallel to the X-axis are electrically connected at the top to a common bit line, as shown by typical bit line 84 connected to memory cell columns 45, 40. The bit lines are connected to a bit line connect circuit 80, as shown in FIG. 3.

Electrical switches, which may be metal-oxide-semiconductor field-effect-transistors (MOSFETs) or other known transistors or equivalent switches, are located between the substrate 20 and the memory cell columns, as shown by transistors 91, 92, 94, 93 associated with memory cell columns 45, 40, 49, 47, respectively. The switches are thus aligned parallel to the Y axis beneath the memory cells of the lowermost memory layer of the stack, as shown in FIG. 3 by the transistors connected to word lines 95, 97. The memory cell columns aligned in each row parallel to the Y axis are electrically connected at the bottom to a common word line, as shown in FIG. 3 by typical word lines 95 (connecting columns 45, 49) and 97 (connecting columns 40, 47). The word lines are connected to word line connect circuit 90.

In the multiple-memory-layer MRAM of this invention the memory cells may be MTJs. One type of MTJ, as described in the previously cited '343 patent, uses a "free" ferromagnetic film whose magnetization is free to rotate in the presence of an applied field, and a "fixed" ferromagnetic film whose magnetization is fixed and does not rotate in the presence of an applied field in the range of interest, i.e., the write field. The fixed ferromagnetic film typically has its magnetization fixed by being "pinned" to an antiferromagnetic film. In this type of MTJ, the memory cell is written by changing the magnetization direction of just the free film, so that the magnetic state of the cell is determined by whether the magnetization of the free film is either parallel or antiparallel to the fixed magnetization direction of the fixed film. Because the magnetic state or "bit" of this type of MTJ memory cell is "stored" in the magnetization direction of the free film, the free film can be considered the storage layer of the cell.

Another type of MTJ memory cell has a "sensing" ferromagnetic film and a reference or "storage" ferromagnetic film. The two films have different coercivities or uniaxial anisotropies, but the magnetization directions of the sensing and storage films are always parallel after writing. The magnetic state of the cell depends on the in-plane magnetization direction of the storage film. This type of MTJ memory cell is depicted in FIG. 4.

Figure 4:
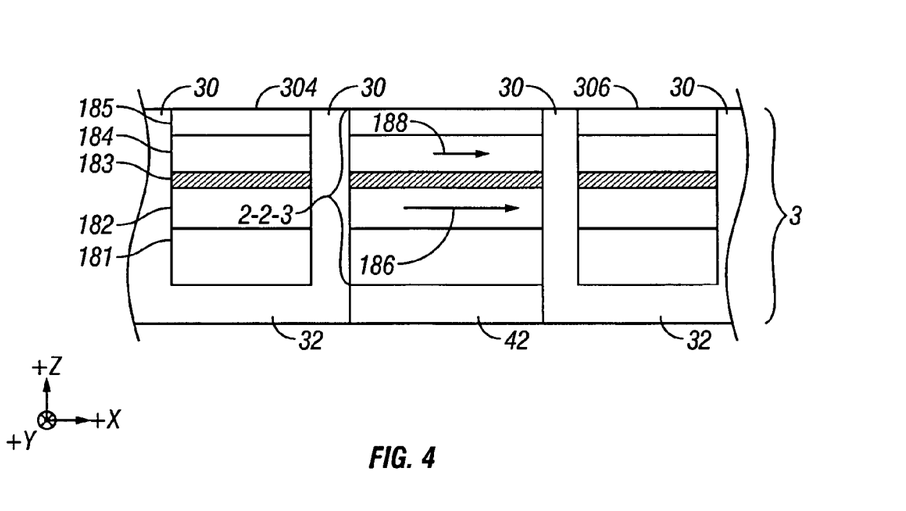
FIG. 4 is a sectional view of a portion of one memory layer of the MRAM of this invention showing the individual films making up a typical memory cell and its laterally-adjacent electrically conductive access lines.

FIG. 4 is a sectional view of a portion of the MRAM illustrating the individual films making up typical memory cell 2-2-3 and typical access lines 304, 306 in odd-numbered memory layer 3. Film 42 is an electrically conductive film, typically Cu or a Cu/Ta bilayer, and provides electrical connection between memory cell 2-2-3 and the memory cell below it (not shown) in the memory cell column 40 (FIGS. 2A–2B and 3). Electrically insulating material 32 is located below each access line to isolate the access lines in each memory layer from the access lines in the memory layer below.

The materials and thicknesses of films 181–185 are selected to form a MTJ as the memory cell 2-2-3, but films 181–185 can also function as access lines 304, 306. The use of films 181–185 for both the memory cells and the access lines in the multiple-memory-layer MRAM simplifies the fabrication process for the MRAM because these films can be deposited sequentially and then patterned to form the individual memory cells and access lines in each memory layer. However, the access lines need not be formed of films 181–185, but can be formed of other electrically conductive materials, such as Cu.

The MTJ 2-2-3 includes a storage ferromagnetic film 182 with a magnetization direction 186, a sensing ferromagnetic film 184 with a magnetization direction 188, and a thin insulating tunnel barrier 183 between films 182 and 184. The storage ferromagnetic film 182 has either a higher coercivity or higher uniaxial anisotropy than that of sensing ferromagnetic film 184, so that switching its magnetization direction 186 requires a higher magnetic field than is required to switch the magnetization direction 188 of the sensing ferromagnetic film 184. The sensing ferromagnetic film 184 is shown as being above tunnel barrier 183, but it can be located below the tunnel barrier with the storage ferromagnetic film 182 then being located above the tunnel barrier 183. The direction of the moment 186 of storage ferromagnetic film 182 determines the magnetic bit state of the MTJ. The magnetization direction 186 of storage ferromagnetic film 182 is aligned parallel to the film's easy axis of magnetization. The MTJ 2-2-3 is "written" when its magnetization direction 186 is switched from one direction to the opposite direction (+/−X directions). The switching of the magnetization direction 186 of the storage film 182 also causes a switching of the magnetization direction 188 of the sensing film 184, so that moments 188 and 186 are always parallel after writing.

The storage ferromagnetic film 182 is formed on an underlayer or seed layer 181. Seed layer 181 may be formed of NiFeCr, a Ta/NiCr bilayer, or similar material. A capping film 185, primarily for corrosion protection, is formed on sensing ferromagnetic film 184. A relatively wide range of materials and thicknesses are known for use in MTJ memory cells, but representative examples for films 181–185 are 2–4 nm Ta or a Ta/NiCr bilayer for seed layer 181; 2–4 nm CoFe or CoFe/NiFe for storage ferromagnetic film 182 and sensing ferromagnetic film 184; 0.5–3.0 nm alumina ($Al_2O_3$) for tunnel barrier 183; and 5–50 nm Ta for capping film 185. The storage ferromagnetic film 182 has a larger magnetic moment or higher uniaxial anisotropy or higher coercivity than sensing ferromagnetic film 184 so that its magnetization direction 186 remains unchanged during switching of the magnetization direction 188 of sensing film 184 for reading. The different uniaxial anisotropy or coercivity can be achieved by varying the composition of the ferromagnetic material, the deposition conditions or seed-layer and/or its structure.

The materials and structure of the typical memory cell and its associated laterally adjacent access lines have been described with respect to FIG. 4 for an odd-numbered memory layer, but the description is substantially identical for even-numbered memory layers, with the primary difference being that the entire structure is rotated 90 degrees about the Z axis. This can be understood by reference back to FIGS. 1B and 1C. Thus in this invention substantially the same materials and fabrication steps can be used for each memory layer in the stack.

Writing a Selected Memory Cell

For an MRAM with memory cells having in-plane magnetization, like the MTJ memory cell, the in-plane applied magnetic field required to switch the magnetic state of the cells can be generated by directing write current with the same polarity through the parallel access lines adjacent to the selected cell. In this invention, the applied magnetic write field is generated by the conductive access lines that are located next to and in substantially the same plane as the memory cells. With this arrangement, multiple memory layers can be easily fabricated because underlying and overlying bit and/or word lines need not be fabricated for each memory layer.

In this invention the selected memory cell is written by applying magnetic fields along both the easy axis and hard axis of the storage ferromagnetic film of the selected cell, with each field being less than the anisotropy field $H_k$. A pair of memory cells, one each from an odd and even pair of memory layers, is "written" at the same time. The writing method will be explained by referring to FIG. 5, which shows the memory cell pair 2-2-3 and 2-2-4 superimposed on a switching astroid. The easy axis of cell 2-2-3 is along the X direction so any field greater than $H_k$ along the X direction will switch the magnetization direction of cell 2-2-3. Similarly, the easy axis of cell 2-2-4 is along the Y direction so any field greater than $H_k$ along the Y direction will switch the magnetization direction of cell 2-2-4. Any net or composite field from a combination of fields along the X and Y directions will switch the magnetization direction of one of the cells if the composite field is greater than the outer boundary 190 of the astroid. For example, if equal fields of sufficient magnitude are applied along the +X and +Y directions so that the composite field is at a 45 degree angle, then the resulting magnetization of cell 2-2-3 will be +X and the resulting magnetization of cell 2-2-4 will be +Y, or the magnetic states of the two cells in the pair will be (1, 1). The resulting magnetic states are shown in FIG. 5 for the other four quadrants of the astroid, resulting in the other three bit combinations [(1,0), (0,0) and (0,1)] for the pair of cells.

Figure 5:
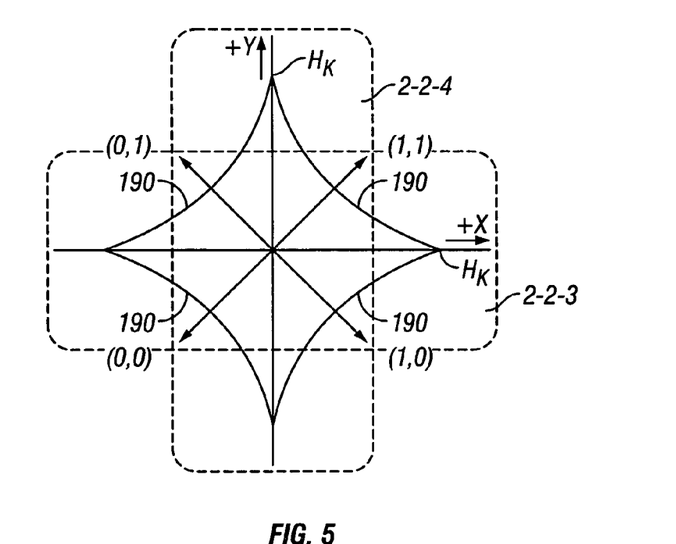
FIG. 5 shows a memory cell pair, with their hard and easy axes of magnetization, superimposed on a switching astroid.

The memory cells in each pair have been depicted with their easy axes orthogonal to each other, as shown in FIG. 5. However, it is possible that the relative orientation of the easy axes of the two memory cells in a pair can be at some other angle, provided they are not parallel. Also, each memory cell has been depicted with its easy axis orthogonal to their associated laterally adjacent access lines, as shown in FIGS. 1B–1C. However, the relative orientation of the memory cells and their orientation relative to their associated access lines can be at an angle other than 90 degrees, provided the two fields applied along the X and Y directions can generate a composite field that exceeds the boundary of the astroid and can reliably produce the four different sets of magnetic states for the paired memory cells.

Figure 6A:
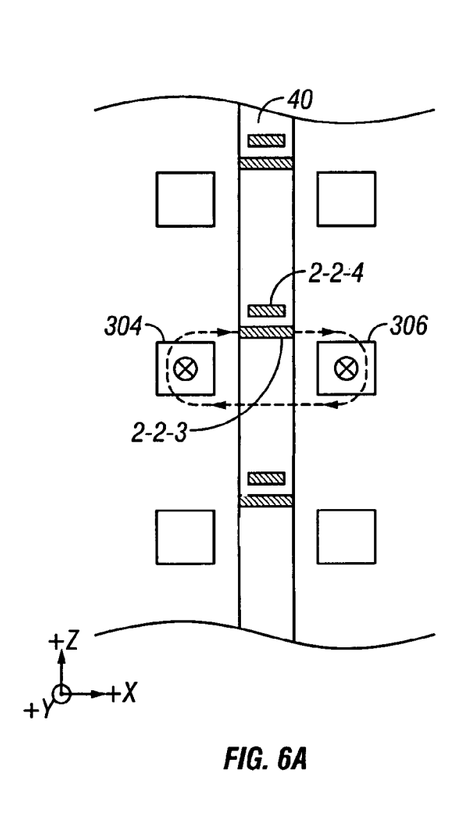
FIGS. 6A–6B are sections through the X-Z and Y-Z planes, respectively, of the MRAM of this invention showing the write fields generated by current through the access lines associated with the respective memory cells.
Figure 6B:
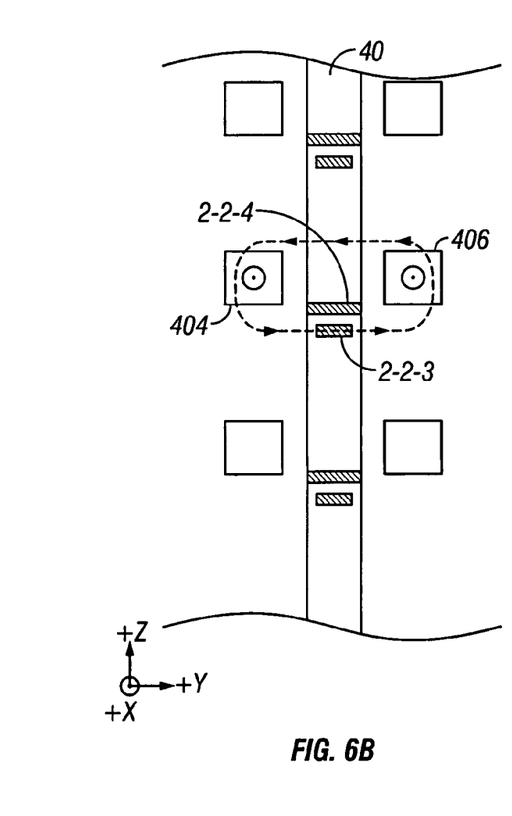

The write fields are applied by current applied in the appropriate direction through the access lines associated with the memory cell pair that includes the selected cell. This is depicted in FIGS. 6A–6B. Assume memory cell 2-2-3 to have a −X magnetization direction (corresponding to a bit value of 0) and is selected to be written to a 1 (i.e., have its magnetization direction switched to the +X direction). When the address of memory cell 2-2-3 is received by access line connect circuit 70 (FIG. 3), access lines 304, 306 and 404, 406 are identified as those lines through which currents are to be directed. Current in the +Y direction (into the paper) through access lines 304, 306 (FIG. 6A) will generate a write field in cell 2-2-3 in the +X direction along the easy axis of cell 2-2-3. Current in the +X direction (out of the paper) through access lines 404, 406 (FIG. 6B) will generate a write field in cell 2-2-3 in the +Y direction along the hard axis of cell 2-2-3. The composite field will be sufficient to switch the magnetization of cell 2-2-3 to the +X direction, as can be understood by reference back to FIG. 5. If cell 2-2-4 in the pair was at an initial 0 bit value, it will be switched to a 1 by the combination of write fields shown in FIGS. 6A–6B. The write circuit connected to access line connect circuit 70 can direct current in either direction through the addressed access lines, in response to the datum input. The direction of the write currents depends on the present magnetic state of the addressed cell, i.e., a 1 or 0, which represents the present direction of magnetization of the storage ferromagnetic film in the addressed cell. For example, if the current directions are reversed in all four access lines from the directions shown in FIGS. 6A–6B, and the magnetization in cell 2-2-3 was initially in the +X direction (bit value 1), then its magnetization will be switched to the −X direction (bit value 0). The magnetic state of cell 2-2-4 in the pair can be switched in a similar manner by appropriate selection of the current through the access lines 304, 306 and 404, 406.

The writing method also allows two bits to be written simultaneously, so that any two-bit sequence of logical bits [00, 01, 10, 11] can be mapped into a pair of physical memory cells by selection of the appropriate combination of write currents to the four access lines associated with the selected pair of memory cells. Thus, as illustrated in FIG. 5, any one of the four sequences [00, 01, 10, 11] would be written by one of four combinations of write currents to generate write fields in one of the corresponding four X-Y directions [(−X, −Y), (−X, +Y), (+X, −Y), (+X, +Y)].

The writing method has been described for the type of MTJ memory cell that has a sensing ferromagnetic film and a storage ferromagnetic film in which writing occurs by changing the magnetization direction of the storage film. However, the writing method is also applicable to an MTJ memory cell that has a free ferromagnetic film and a fixed ferromagnetic film, in which case writing occurs by changing the magnetization direction of the free film relative to the fixed film. The free film can be considered the storage film because the magnetic state of the cell, i.e., a 1 or 0, is "stored" in the magnetization direction of the free film.

Reading a Selected Memory Cell

The method for reading a selected cell in the MRAM of this invention will be described with reference to FIGS. 3, 5 and 6A–6B and will assume memory cell 2-2-3 in memory layer 3 to be the selected cell to be read. Referring first to FIG. 3, the address of selected cell 2-2-3 identifies bit line 84 connected to bit line connect circuit 80, word line 97 connected to word line connect circuit 90, and access lines 304, 306 and 404, 406 connected to access line connect circuit 70. Bit line 84 is connected to the top of memory cell column 40 and word line 97 is connected to the bottom of memory cell column 40, which is the column containing selected cell 2-2-3.

To read the magnetic state of cell 2-2-3, a first current pulse is applied to the access lines 304, 306 and 404, 406 in the directions shown in FIGS. 6A and 6B. The current values are selected so that the amplitude of the generated field is sufficient to switch the sensing films in both memory cells of the pair (2-2-3 and 2-2-4). The applied fields are thus in the +X and +Y directions (FIG. 5) so that the magnetic state of the pair of sensing films after the first pulse is (1,1). The switch 92 is then turned on and current flows in bit line 84 and memory cell column 40. The electrical resistance R1 of the memory cell column 40 is then sensed, using conventional resistance detection circuitry. Next a second current pulse of the same amplitude as that of the first pulse is then applied to the access lines 304, 306 in the same direction as in FIG. 6A, and to the access lines 404, 406 in the opposite direction to that shown in FIG. 6B (in the −X direction or into the paper). The applied fields from the second current pulse are thus in the −X and +Y directions (FIG. 5) so that magnetic state of the pair of sensing films after the application of the second pulse is (0,1). The electrical resistance R2 of the memory cell column 40 is then sensed after the second pulse is applied. Since the resistances of memory cell 2-2-4 are the same in the two cases because the magnetization direction of the sensing film in cell 2-2-4 is the same (i.e., in the +Y direction), the difference of the two resistance readings R1, R2 determines the magnetization direction of memory cell 2-2-3 and thus cell 2-2-3 can be determined to be a 0 or a 1. If R1<R2 then the storage film of cell 2-2-3 is magnetized in the +X direction because a lower resistance represents parallel magnetizations of the storage and reference layers, while a higher resistance represents antiparallel magnetizations. If R1>R2 then the storage film of cell 2-2-3 is magnetized in the −X direction because a higher resistance represents antiparallel magnetizations of the sensing and storage films. Thus by comparing R1 and R2 a selected memory cell can be read.

Writing and Reading with Improved Cell Selectivity

In the stacked multiple-memory-layer MRAM according to this invention, where the selected cell is written and read by the application of currents through the access lines laterally adjacent the selected cell in the same memory layer as the selected cell, it may be desirable to assure that cells in the other memory layers in the stack are not written when the selected cell is being written or read. The memory cell selectivity can be improved by the use of oppositely directed current through access lines in the odd or even memory layer nearest the odd or even memory layer, respectively, containing the selected cell. The oppositely directed current generates a superposing field near the selected cell to assist in writing or reading the selected cell, and a compensating magnetic field near the non-selected cells that counteracts the field from the access lines laterally adjacent the selected cell.

Figure 7A:
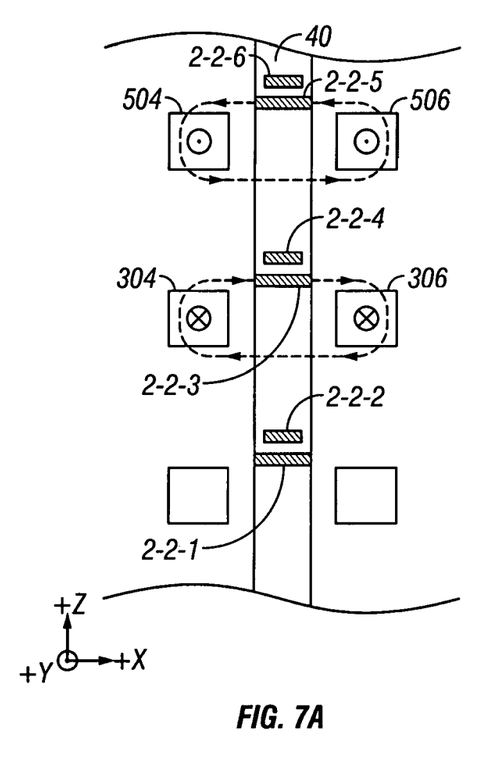
FIG. 7A is a sectional view through the X-Z plane of the MRAM of this invention showing the superposition of magnetic fields generated by write currents directed in one direction through the access lines on each side of the memory cell and oppositely directed write currents through access lines in the nearest odd-numbered memory layer.
Figure 7B:
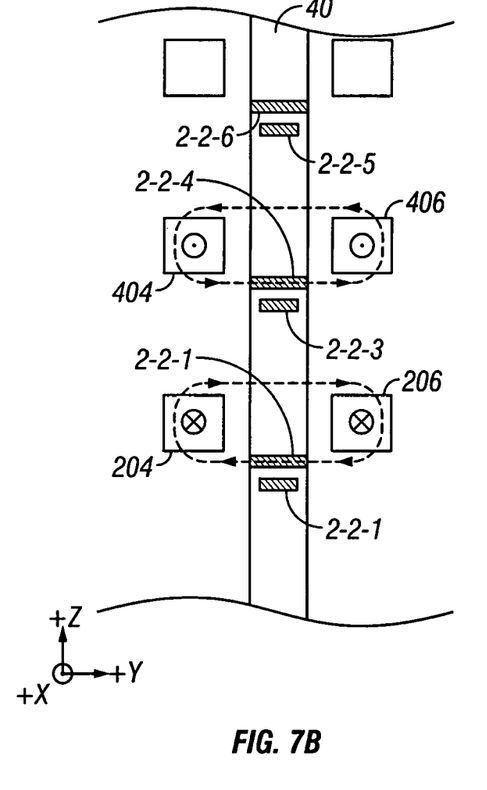
FIG. 7B is a sectional view through the Y-Z plane of the MRAM of this invention showing the superposition of magnetic fields generated by write currents directed in one direction through the access lines on each side of the memory cell and oppositely directed write currents through access lines in the nearest even-numbered memory layer.

This improved cell selectivity will be described with reference to FIGS. 7A–7B. In FIG. 7A current is directed through access lines 504, 506 in the −Y direction (out of the paper) to generate a magnetic field in the opposite direction to the field generated by write current through access lines 304, 306. Thus, the in-plane fields in the region between memory layers 3 and 5 near the selected pair of memory cells 2-2-3 and 2-2-4 are in the same direction and are thus superposed or enhanced, while the fields above the selected memory cells (near memory cells 2-2-5 and 2-2-6) and below the selected memory cells (near memory cells 2-2-2 and 2-2-1) are in opposite directions and thus essentially counteract to reduce the field. Similarly, in FIG. 7B current is directed through access lines 204, 206 in the +X direction (into the paper) to generate a magnetic field in the opposite direction to field lines generated by write current through access lines 404, 406. Thus, the in-plane fields in the region between memory layers 2 and 4 near the selected pair of memory cells 2-2-3 and 2-2-4 are in the same direction and are thus superposed or enhanced, while the fields above the selected memory cells (near memory cells 2-2-5 and 2-2-6) and below the selected memory cells (near memory cells 2-2-2 and 2-2-1) are in opposite directions and thus essentially counteract to reduce the field. The use of additional currents through the access lines in the memory layers immediately above and below the pair of memory layers containing the selected memory cell pair enables the magnetization direction in selected memory cells 2-2-3 and 2-2-4 to be written or read without switching the magnetization direction in the non-selected cells above and below.

As described above and depicted in FIGS. 7A–7B, the compensating field is applied by oppositely directed current through access lines in memory layer 5 above the memory layer 3 (FIG. 7A) and in memory layer 2 below memory layer 4 (FIG. 7B). However, the compensating field can also be generated using the access lines in memory layer 1 below memory layer 3 (FIG. 7A) and in memory layer 6 above memory layer 4 (FIG. 7B).

If a memory cell in memory layer 1 is to be read or written then the access lines 52, 54, 56 and 58 in the lower layer that contains only access lines (layer 0 in FIG. 2B) can be used to generate the compensating magnetic field. Similarly, if a memory cell in memory layer 6 is to be read or written then the access lines 62, 64, 66 and 68 in the upper layer that contains only access lines (layer 7 in FIG. 2A) can be used to generate the compensating magnetic field.

Flux Guides

The writing and reading to the memory cells in the MRAM of this invention may be improved with the use of flux guides associated with the access lines. The flux guides are thin films of soft ferromagnetic material with high magnetic permeability located either in contact with or spaced from the electrically conductive access lines. Typical materials include NiFe and NiFeCo alloys. The use of this type of soft ferromagnetic material surrounding but in contact with the word line and bit line conductors in single-layer MRAM structures has been proposed as "cladding" to enhance the field from the conductors because it is known that high permeability reduces magnetic reluctance. Cladded MRAM conductors are described in U.S. Pat. No. 6,559,511. In the present invention, however, the soft ferromagnetic material may also act like cladding to enhance the field, but is located to guide the peak flux from the access lines to the sensing layers of the memory cells. Thus the flux guides need not be in contact with the access lines, like cladding layers, but can be spaced from the access lines.

Figure 8A:
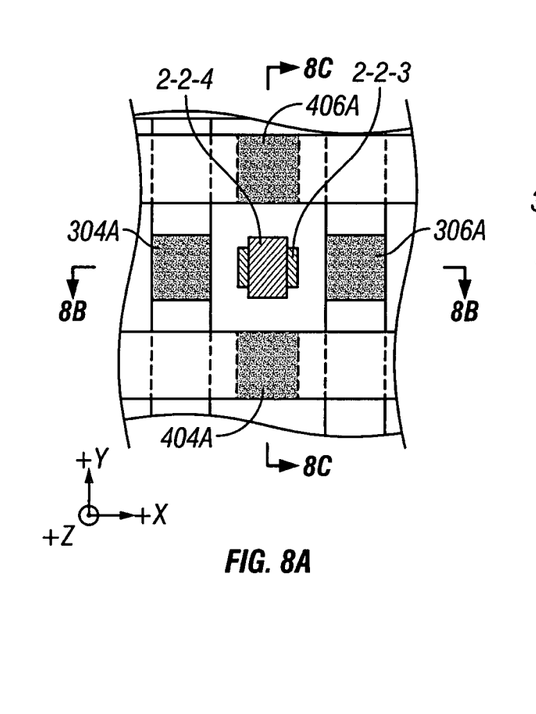
FIG. 8A is a top view of a portion of the MRAM of this invention showing a pair of memory layers with flux guides located on the access lines near the memory cells.
Figure 8B:
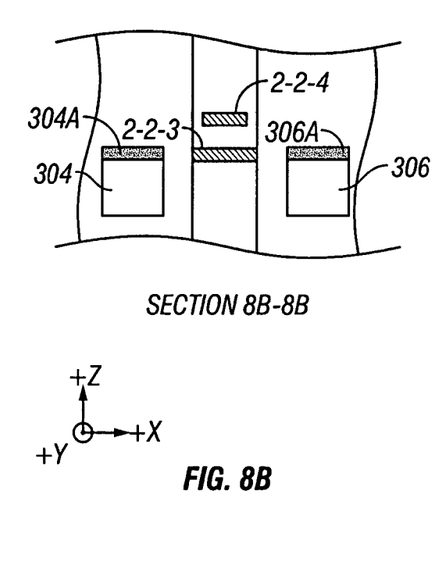
FIGS. 8B–8C are sectional views through the X-Z and Y-Z planes, respectively, at the section lines 8B—8B and 8C—8C, respectively, of FIG. 8A, showing the flux guides on top of the access lines and aligned in substantially the same planes as the sensing layers of the memory cells.
Figure 8C:
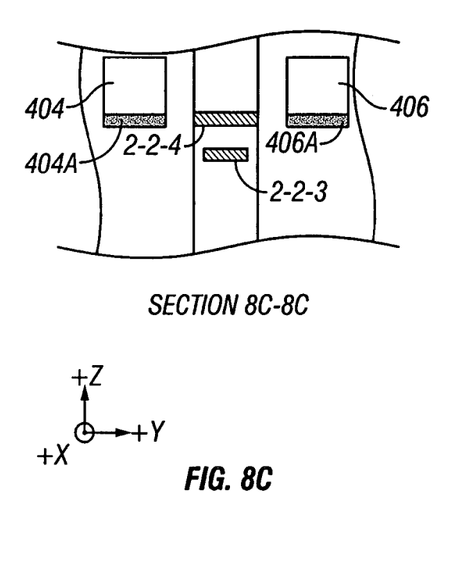

FIGS. 8A–8C illustrate the MRAM with flux guides located on the access lines near the memory cells and in substantially the same planes as the memory cells. FIG. 8A is a top view showing memory layer 4 above memory layer 3. The flux guides 304A and 306A are aligned along the X direction to guide flux along the easy axis of memory cell 2-2-3, and flux guides 404A and 406A are aligned along the Y direction to guide flux along the easy axis of memory cell 2-2-4. As shown in FIG. 8B, which is section 8B—8B of FIG. 8A through the X-Z plane, the flux guides 304A and 306A are located on top of respective access lines 304, 306 and are aligned in generally the same plane as memory cell 2-2-3. Similarly, as shown in FIG. 8C, which is section 8C—8C of FIG. 8A through the Y-Z plane, the flux guides 404A and 406A are located on the bottom of respective access lines 404, 406 and are aligned in generally the same plane as memory cell 2-2-4. When current is directed through the access lines laterally adjacent the memory cell, the flux from the magnetic field generated by the current is concentrated in the flux guides and guided to the memory cell, to thereby increase the magnetic field to which the memory cell is exposed.

Figure 9:
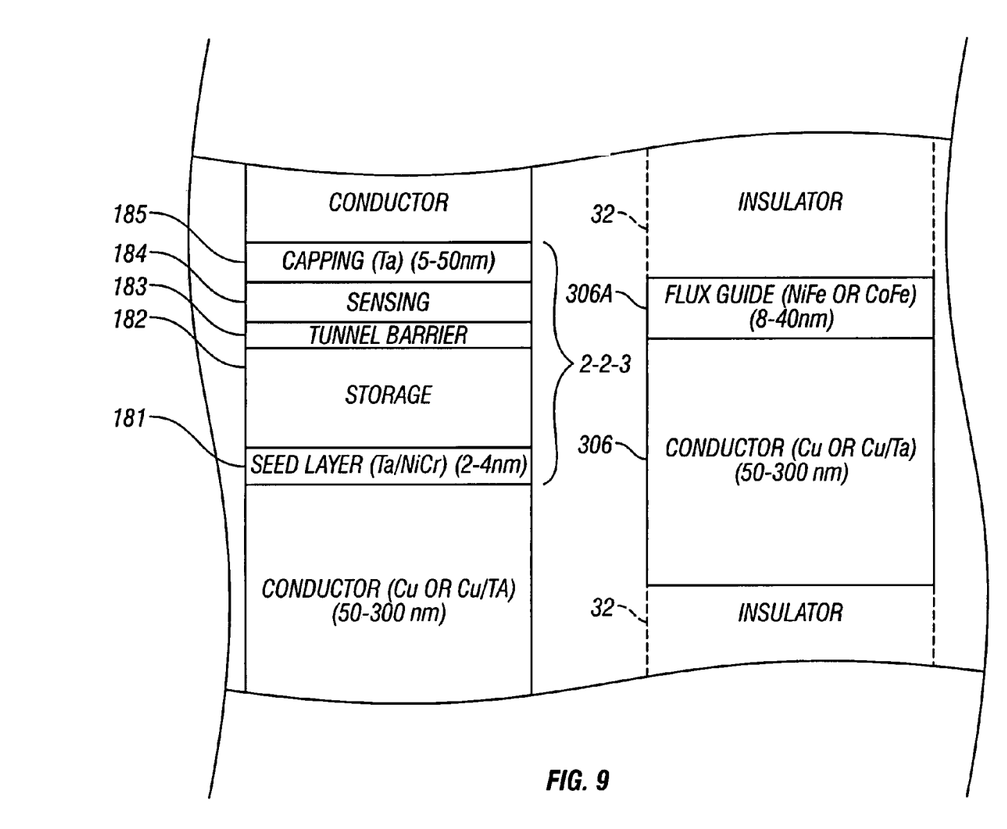
FIG. 9 is a sectional view of a MTJ memory cell and one of its laterally adjacent access lines with a flux guide showing the representative materials and thicknesses of the films.

FIG. 9 is a view of memory cell 2-2-3 and laterally adjacent access line 306 with flux guide 306A to illustrate the representative materials and approximate thicknesses of the films making up the access lines and memory cells in the embodiment of FIGS. 8A–8C. The flux guide 306A can be located in substantially the same plane as the sensing layer of memory cell 2-2-3, which in this example is the sensing ferromagnetic film 184 of an MTJ memory cell (as described previously with respect to FIG. 4). Alternatively, the flux guide can be located in substantially the same plane as the storage layer 182. If the memory cell is an MTJ with a free film and a fixed film, the flux guide can be located in substantially the same plane as the free film.

While the flux guides have been shown and described in FIGS. 8A–8C as a plurality of discrete flux guides or flux guide elements patterned on the access lines laterally adjacent the memory cells, as can be seen by the discrete flux guides 304A, 306A, 404A and 406A in FIG. 8A, each flux guide can also be formed as a continuous film over the entire length of its associated access line. The flux guides have also been shown and described as being directly in contact with the conductive access lines. However, the flux guides can be spaced from the access lines by an insulator. Thus, unlike a cladding layer, each flux guide can have an insulating film located between it and its associated access line.

Figure 10A:
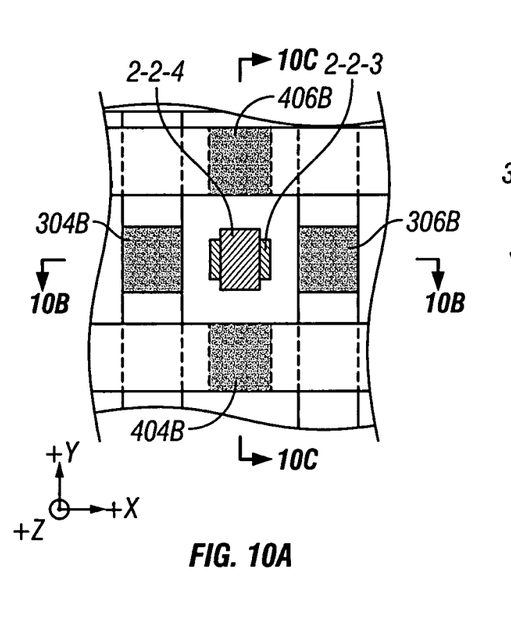
FIG. 10A is a top view of a portion of the MRAM of this invention showing a pair of memory layers with a plurality of flux guide elements associated with the access lines in both layers and located between the memory layers.
Figure 10B:
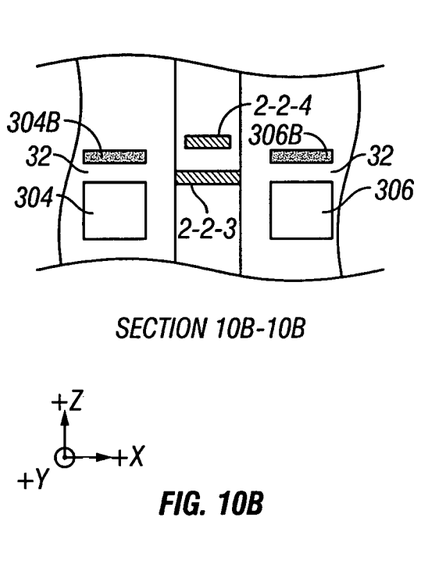
FIGS. 10B–10C are sectional views through the X-Z and Y-Z planes, respectively, at the section lines 10B—10B and 10C—10C, respectively, of FIG. 10A, showing the flux guide elements spaced from the access lines and located in a plane between the access lines of the two layers.
Figure 10C:
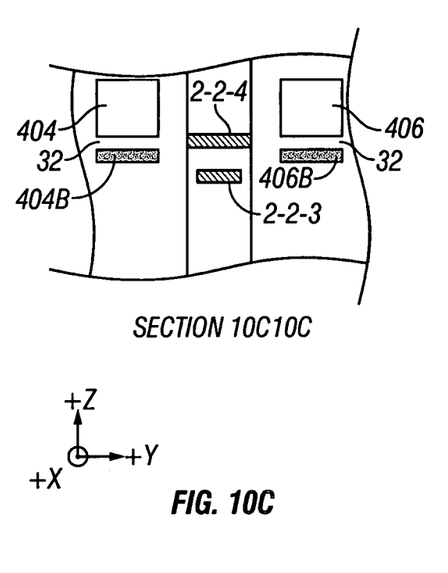

FIGS. 10A–10C illustrate the MRAM with discrete flux guides or flux guide elements that are spaced from the access lines by electrically insulating material. FIG. 10A is a top view showing memory layer 4 above memory layer 3. The flux guides 304B and 306B are aligned along the X direction to guide flux along the easy axis of memory cell 2-2-3, and flux guides 404B and 406B are aligned along the Y direction to guide flux along the easy axis of memory cell 2-2-4. However, unlike the embodiments of FIGS. 8A–8C, and as shown in FIG. 10B, which is section 10B—10B of FIG. 10A through the X-Z plane, the flux guides 304B and 306B are spaced above respective access lines 304, 306 by electrically insulating material 32 and are aligned generally in the Z direction between the memory cells 2-2-3 and 2-2-4. Similarly, as shown in FIG. 10C, which is section 10C—10C of FIG. 10A through the Y-Z plane, the flux guides 404B and 406B are spaced below respective access lines 404, 406 by electrically insulating material 32 and are aligned generally in the Z direction between the memory cells 2-2-3 and 2-2-4. The flux guide elements 304B, 306B, 404B, 406B are in substantially the same plane and are located in the region between the two adjacent memory layers that contain the access lines with which the flux guide elements are associated. Because the flux guide elements are in substantially the same plane, fabrication is made easier because a single masking layer can be used for patterning a single flux guide layer for each pair of memory layers.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic random access memory (MRAM) comprising:
   a substrate;
   a pair of memory layers stacked on the substrate, the pair comprising a first memory layer comprising a plurality of rows of memory cells and a plurality of electrically conductive access lines with each memory cell row being located between two access lines, and a second memory layer comprising a plurality of rows of memory cells and a plurality of electrically conductive access lines with each memory cell row being located between two access lines, the access lines in the second memory layer being oriented generally orthogonal to the access lines in the first memory layer, and the memory cells in the second layer being generally aligned with the memory cells in the first layer to form a plurality of memory cell columns extending generally perpendicularly from the substrate, each column including a pair of memory cells; and
   access line circuitry for directing electrical current through the access lines.

2. The MRAM of claim 1 wherein the substrate is parallel to the X-Y plane of an X-Y-Z coordinate system and a direction perpendicular to the substrate is parallel to the Z axis, wherein the access lines in the first layer are aligned parallel to the Y axis, the access lines in the second layer are aligned parallel to the X axis, and the memory cell columns are aligned parallel to the Z axis.

3. The MRAM of claim 1 further comprising a plurality of said pairs of memory layers stacked on the substrate.

4. The MRAM of claim 3 wherein the plurality of pairs of memory layers form a plurality of memory cell pairs in each memory cell column, and further comprising electrically conducting material located between the memory cell pairs in each of the memory cell columns.

5. The MRAM of claim 1 wherein each memory cell includes a ferromagnetic storage layer having substantially uniaxial magnetic anisotropy with an easy axis and a hard axis, and wherein the easy axes of the storage layers in the pair of memory cells in each memory cell column are nonparallel to one another.

6. The MRAM of claim 5 wherein the easy axes of the storage layers in the pair of memory cells in each memory cell column are generally orthogonal.

7. The MRAM of claim 6 wherein the easy axis of the ferromagnetic storage layer in each memory cell is oriented generally orthogonal to the access lines in the memory layer of each said memory cell.

8. The MRAM of claim 1 wherein the first memory layer is between the substrate and the second memory layer, the memory cells in the first memory layer are located above the midplane of the first layer, and the memory cells in the second layer are located below the midplane of the second layer.

9. The MRAM of claim 1 further comprising a lower access line layer located between the substrate and the first memory layer and comprising rows of access lines aligned generally parallel to the access lines in the second memory layer.

10. The MRAM of claim 1 further comprising an upper access line layer located above the second memory layer and comprising rows of access lines aligned generally parallel to the access lines in the first memory layer.

11. The MRAM of claim 1 wherein the memory cells and access lines in each memory layer are formed of a plurality of substantially the same films and wherein the memory cells and the access lines in each memory layer are separated by electrically insulating material.

12. The MRAM of claim 1 further comprising a magnetic flux guide associated with each access line for concentrating the magnetic flux generated by current through the access line.

13. The MRAM of claim 12 wherein the flux guide is in contact with the access line.

14. The MRAM of claim 12 wherein each flux guide comprises a plurality of discrete flux guides patterned along the length of the associated access line, the discrete flux guides being aligned generally with the memory cells in the row of memory cells laterally adjacent the access line.

15. The MRAM of claim 12 wherein the flux guide is spaced from the access line by electrically insulating material.

16. The MRAM of claim 15 wherein each flux guide comprises a plurality of discrete flux guides, all of the discrete flux guides being located in regions between the memory layers and being in substantially the same plane.

17. The MRAM of claim 1 wherein the memory cells are magnetic tunnel junctions (MTJs), each MTJ having a sensing ferromagnetic film and a storage ferromagnetic film spaced apart by a tunnel barrier, the storage film having an in-plane magnetization aligned along a magnetization axis in the absence of an applied magnetic field and substantially free to rotate from a first direction along its magnetization axis to an opposite direction along its magnetization axis in the presence of an applied magnetic field, and wherein the magnetization axes in the storage films in the pair of MTJs in each memory cell column are generally orthogonal.

18. The MRAM of claim 17 further comprising a plurality of magnetic flux guide elements associated with each access line for directing the magnetic flux generated by current through the access line to the storage ferromagnetic films of the MTJs.

19. The MRAM of claim 18 wherein each flux guide element is aligned in substantially the same plane as the storage ferromagnetic film of its associated MTJ.

20. The MRAM of claim 1 wherein the memory cells are magnetic tunnel junctions (MTJs), each MTJ having a free ferromagnetic film with an in-plane magnetization aligned along a magnetization axis in the absence of an applied magnetic field and substantially free to rotate from a first direction along its magnetization axis to an opposite direction along its magnetization axis in the presence of an applied magnetic field, and wherein the magnetization axes in the pair of MTJs in each memory cell column are generally orthogonal.

21. The MRAM of claim 20 further comprising a plurality of magnetic flux guide elements associated with each access line for directing the magnetic flux generated by current through the access line to the free ferromagnetic films of the MTJs.

22. The MRAM of claim 21 wherein each flux guide element is aligned in substantially the same plane as the free ferromagnetic film of its associated MTJ.

23. The MRAM of claim 1 further comprising a plurality of said pairs of memory layers stacked on the substrate, the plurality of memory layer pairs forming a stack of alternating odd and even numbered memory layers, the odd memory layers being like said first memory layer and the even memory layers being like said second memory layer; and wherein the access line circuitry, in response to a memory cell address identifying a selected cell by odd or even memory layer, directs electrical current in one direction through the access lines nearest said selected cell in the selected layer and in the opposite direction through the access lines nearest said selected cell in the nearest odd layer if the selected layer is an odd layer and the nearest even layer if the selected layer is an even layer.

24. The MRAM of claim 1 further comprising:
a plurality of electrically conductive bit lines, each bit line being connected to the memory cells in a row of memory cells in the uppermost memory layer;
a plurality of switches on the substrate, each switch being electrically connected to a memory cell column, whereby the switches are arranged in rows below the lowermost memory layer of the stack; and
a plurality of electrically conductive word lines, each word line connecting the switches in a row of switches.

25. The MRAM of claim 24 further comprising bit line circuitry for directing electrical current to the bit line connected to the memory cell column containing a selected cell whose magnetic state is to be read, and word line circuitry for turning on the switches in the row of switches connected to the memory cell column containing said selected cell.

26. A magnetic random access memory (MRAM) comprising:
a substrate;
a plurality of pairs of memory layers stacked on the substrate and forming a stack of alternating odd and even numbered memory layers, each pair comprising an odd memory layer comprising a plurality of rows of memory cells and a plurality of electrically conductive access lines, with each memory cell row being located between two access lines, and an even memory layer comprising a plurality of rows of memory cells and a plurality of electrically conductive access lines, with each memory cell row being located between two access lines; the access lines in the even memory layers being oriented generally orthogonal to the access lines in the odd memory layers and the memory cells in each layer being generally aligned with the memory cells in the other layers to form a plurality of memory cell columns extending generally perpendicularly from the substrate, each column including a plurality of pairs of memory cells;

a plurality of electrically conductive bit lines, each bit line being connected to the memory cells in a row of memory cells in the uppermost memory layer in the stack;

a plurality of switches on the substrate, each switch being electrically connected to a memory cell column, whereby the switches are arranged in rows below the lowermost memory layer in the stack;

a plurality of electrically conductive word lines, each word line connecting the switches in a row of switches;

access line circuitry responsive to the address of a selected memory cell whose magnetic state is to be read for directing electrical current through the access lines nearest said selected cell;

bit line circuitry responsive to said selected cell address for directing electrical current to the bit line connected to the memory cell column containing said selected cell; and word line circuitry responsive to said selected cell address for turning on the switches in the row of switches connected to the memory cell column containing said selected cell;

whereby current flows through said selected cell simultaneous with current through the access lines.

27. The MRAM of claim 26 wherein the access line circuitry also directs electrical current through the access lines nearest said selected cell in the nearest even layer if the selected layer is an odd layer and the nearest odd layer if the selected layer is an even layer.

28. The MRAM of claim 26 wherein the access line circuitry also directs electrical current through the access lines nearest said selected cell in the nearest odd layer if the selected layer is an odd layer and the nearest even layer if the selected layer is an even layer.

29. The MRAM of claim 26 wherein each memory cell includes a ferromagnetic storage layer having substantially uniaxial magnetic anisotropy with an easy axis and a hard axis, and wherein the easy axes of the storage layers in each pair of memory cells are substantially orthogonal to one another.

30. The MRAM of claim 29 wherein the easy axis of the ferromagnetic storage layer in each memory cell is oriented generally orthogonal to the access lines in the memory layer of each said memory cell.

31. The MRAM of claim 26 wherein the memory cells in each odd memory layer are located above the midplane of their memory layer, and the memory cells in each even memory layer are located below the midplane of their memory layer.

32. The MRAM of claim 26 further comprising a lower access line layer located between the substrate and the lowermost odd memory layer in the stack and comprising rows of access lines aligned generally parallel to the access lines in the even memory layers.

33. The MRAM of claim 26 further comprising an upper access line layer located above the uppermost even memory layer in the stack and comprising rows of access lines aligned generally parallel to the access lines in the odd memory layers.

34. The MRAM of claim 26 wherein the memory cells and access lines in each memory layer are formed of a plurality of substantially the same films and wherein the memory cells and the access lines in each memory layer are separated by electrically insulating material.

35. The MRAM of claim 26 wherein the memory cells are magnetic tunnel junctions (MTJs), each MTJ having a sensing ferromagnetic film and a storage ferromagnetic film spaced apart by a tunnel barrier, the storage film having an in-plane magnetization aligned along a magnetization axis in the absence of an applied magnetic field and substantially free to rotate from a first direction along its magnetization axis to an opposite direction along its magnetization axis in the presence of an applied magnetic field, and wherein the magnetization axes in the storage films in the pair of MTJs in each memory cell column are generally orthogonal.

36. The MRAM of claim 26 wherein the memory cells are magnetic tunnel junctions (MTJs), each MTJ having a free ferromagnetic film with an in-plane magnetization aligned along a magnetization axis in the absence of an applied magnetic field and substantially free to rotate from a first direction along its magnetization axis to an opposite direction along its magnetization axis in the presence of an applied magnetic field, and wherein the magnetization axes in the pair of MTJs in each memory cell column are generally orthogonal.

37. The MRAM of claim 26 further comprising a plurality of magnetic flux guide elements associated with each access line for directing the magnetic flux generated by current through the access line to the memory cells.

38. The MRAM of claim 37 wherein the flux guide elements are spaced from their associated access line by electrically insulating material.

39. The MRAM of claim 26 further comprising a plurality of flux guide elements associated with the access lines in adjacent memory layers and located in regions between the memory layers for directing the magnetic flux generated by current through the access lines to the memory cells, all of the flux guide elements between two adjacent memory layers being in substantially the same plane.

* * * * *